United States Patent
Yu et al.

(10) Patent No.: US 9,514,993 B2
(45) Date of Patent: Dec. 6, 2016

(54) METHOD FOR MANUFACTURING SEMICONDUCTOR DEVICES COMPRISING EPITAXIAL LAYERS

(71) Applicant: UNITED MICROELECTRONICS CORP., Hsin-Chu (TW)

(72) Inventors: Chun-Wei Yu, Changhua County (TW); Ted Ming-Lang Guo, Tainan (TW); Hsu Ting, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/664,933

(22) Filed: Mar. 23, 2015

(65) Prior Publication Data

US 2016/0284601 A1 Sep. 29, 2016

(51) Int. Cl.
 *H01L 21/8238* (2006.01)
 *H01L 21/283* (2006.01)
 *H01L 21/308* (2006.01)

(52) U.S. Cl.
 CPC ..... *H01L 21/823814* (2013.01); *H01L 21/283* (2013.01); *H01L 21/3085* (2013.01); *H01L 21/823878* (2013.01)

(58) Field of Classification Search
 CPC .. H01L 21/8238; H01L 21/308; H01L 21/283; H01L 21/823878; H01L 21/823814; H01L 27/0922
 See application file for complete search history.

(56) References Cited

U.S. PATENT DOCUMENTS

| 8,236,659 | B2 | 8/2012 | Tsai et al. | |
|---|---|---|---|---|
| 2009/0023258 | A1* | 1/2009 | Liang | H01L 21/82381 438/222 |
| 2014/0027820 | A1* | 1/2014 | Aquilino | H01L 21/76232 257/288 |
| 2014/0273366 | A1 | 9/2014 | Lin et al. | |

* cited by examiner

*Primary Examiner* — Selim Ahmed
(74) *Attorney, Agent, or Firm* — Winston Hsu; Scott Margo

(57) ABSTRACT

A method for manufacturing semiconductor devices includes following steps. A substrate including a first gate structure and a second gate structure formed thereon is provided. The first gate structure and the second gate structure are complementary to each other. Next, a first mask layer covering the second gate structure is formed and followed by forming first recesses in the substrate at two respective sides of the first transistor. Then, forming the first recesses, a first epitaxial layer is formed in each first recess. After forming the first epitaxial layers, a local protecting cap is formed on the first epitaxial layers and followed by removing the first mask layer.

8 Claims, 4 Drawing Sheets

METHOD FOR MANUFACTURING SEMICONDUCTOR DEVICES COMPRISING EPITAXIAL LAYERS

BACKGROUND OF THE INVENTION

1. Field of the Invention

The present invention relates to a method for manufacturing semiconductor devices, and more particularly, to a method for manufacturing semiconductor devices having an epitaxial source/drain.

2. Description of the Prior Art

Epitaxial structures are prevalently used in a wide variety of semiconductor applications. For example, the prior art usually forms epitaxial structures in a single crystal substrate by performing a selective epitaxial growth (hereinafter abbreviated as SEG) method. Since the epitaxial structures have the crystalline orientation almost identical to the crystalline orientation of the substrate, the epitaxial structures serves as a raised source/drain or a recessed source/drain for the semiconductor device. Because the lattice constant of the epitaxial structures is larger than that of the silicon substrate, a strain stress is generated to the channel region of the meta-oxide semiconductor (hereinafter abbreviated as MOS) transistor device. Accordingly, carrier mobility in the channel region is improved and the speed of the MOS transistor device is increased. In other words, the epitaxial structures serve as a selective strain scheme (SSS) by rendering strain stress to improve the carrier mobility.

Although the epitaxial structures efficiently improve device performance, it increases complexity of the semiconductor fabrication and difficulties of process control. For example, masks are required to block regions where the epitaxial structures are not to be formed. It is found the epitaxial structures are damaged or consumed, and the strain stress is consequently reduced when removing the masks. That is, selective strain scheme (SSS) suffers strain stress loss due to mask removal and thus solution is in need.

SUMMARY OF THE INVENTION

According to an aspect of the present invention, a method for manufacturing semiconductor devices is provided. According to the method, a substrate including a first gate structure and a second gate structure formed thereon is provided. The first gate structure and the second gate structure are complementary to each other. Next, a first mask layer covering the second gate structure is formed and followed by forming first recesses in the substrate at two respective sides of the first gate structure. Then, a first epitaxial layer is formed in each first recess. After forming the first epitaxial layer, a local protecting cap is formed on the first epitaxial layer and followed by removing the first mask layer.

According to the method for manufacturing the semiconductor devices provided by the present invention, a local protecting cap is formed on the first epitaxial layer so that the first epitaxial layer is protected during removing the first mask layer. Consequently, consumption and/or damage to the first epitaxial layer are efficaciously reduced and thus strain stress loss is avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are drawings illustrating a method for manufacturing semiconductor devices provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
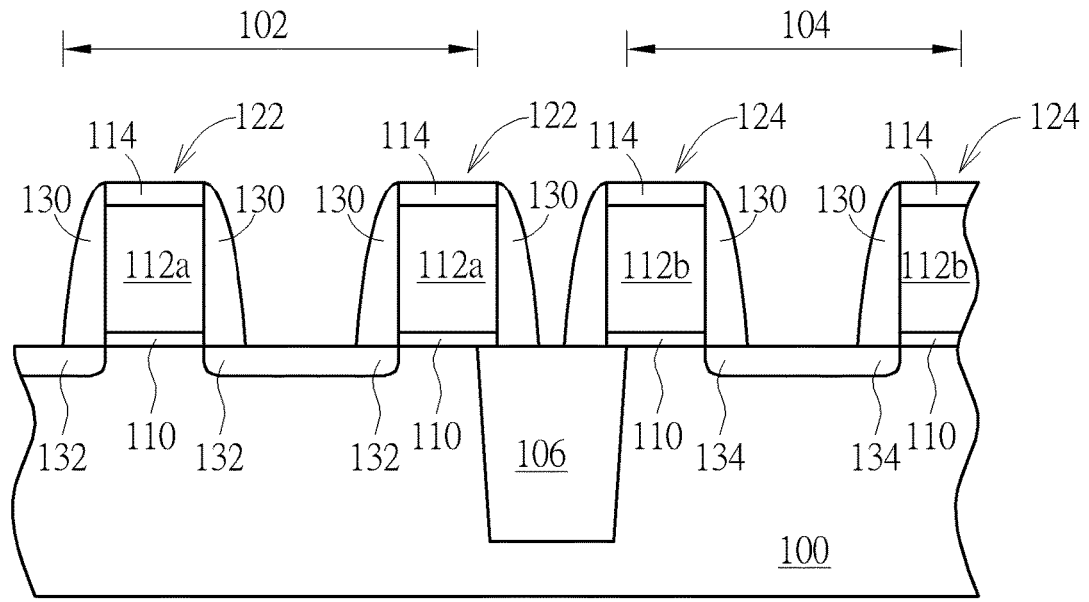

FIGS. 1-7 are drawings illustrating a method for manufacturing semiconductor devices provided by a preferred embodiment of the present invention. As shown in FIG. 1, the preferred embodiment first provides a substrate 100 including a semiconductor material, such as silicon. The substrate 100 further includes a pMOS region 102 for accommodating pMOS transistor devices and an nMOS region 104 for accommodating nMOS transistor devices defined thereon, and at least a STI 106 is formed between the pMOS region 102 and the nMOS region 104 for providing electrical isolation. The preferred embodiment further provides a gate structure 122 formed in the pMOS region 102 and a gate structure 124 formed in the nMOS region 104, respectively. The gate structures 122 and the gate structure 124 respectively include a gate dielectric layer 110, a gate electrode 112a/112b, and a cap layer 114 sequentially and upwardly stacked on the substrate 100. It is well-known to those skilled in the art that the cap layer 114 is formed to cover the gate electrode 112a/112b and to protect the gate electrode 112a/112b from damage that may be caused in any process such as photolithograph process, ion implantation, etching process, or any needed cleaning process in the semiconductor fabricating process. According to the preferred embodiment, the gate structure 122 is a gate structure for a pMOS transistor device and the gate structure 124 is a gate structure for an nMOS transistor device. Thus those skilled in the art would easily realize that the gate structures 122 and 124 are complementary to each other.

Please still refer to FIG. 1. Next, a spacer 130 is formed on sidewalls of the gate structure 122 and the gate structure 124, respectively. Subsequently, different ion implantations are performed to form p-typed lightly-doped drains (hereinafter abbreviated as LDDs) 132 in the substrate 100 respectively at two sides of the gate structure 112 in the pMOS region 102 and to form n-typed LDDs 134 in the substrate 100 respectively at two sides of the gate structure 124 in the nMOS region 104. The spacer 130 preferably is a multi-layered structure including an L-shaped seal layer (not shown) and an insulating layer covering the seal layer. The spacers 130 formed on the sidewalls of the gate structure 122 and the gate structure 124 are used to protect the sidewalls of the gate structure 122 and the gate structure 124 and to define locations for forming the source/drain. It is well-known to those skilled in the art that dopants for forming the LDDs 132/134 are laterally diffused to the substrate 100 under the spacers 130 of the gate structure 122 and the gate structure 124 by anneal treatment.

Figure 2:
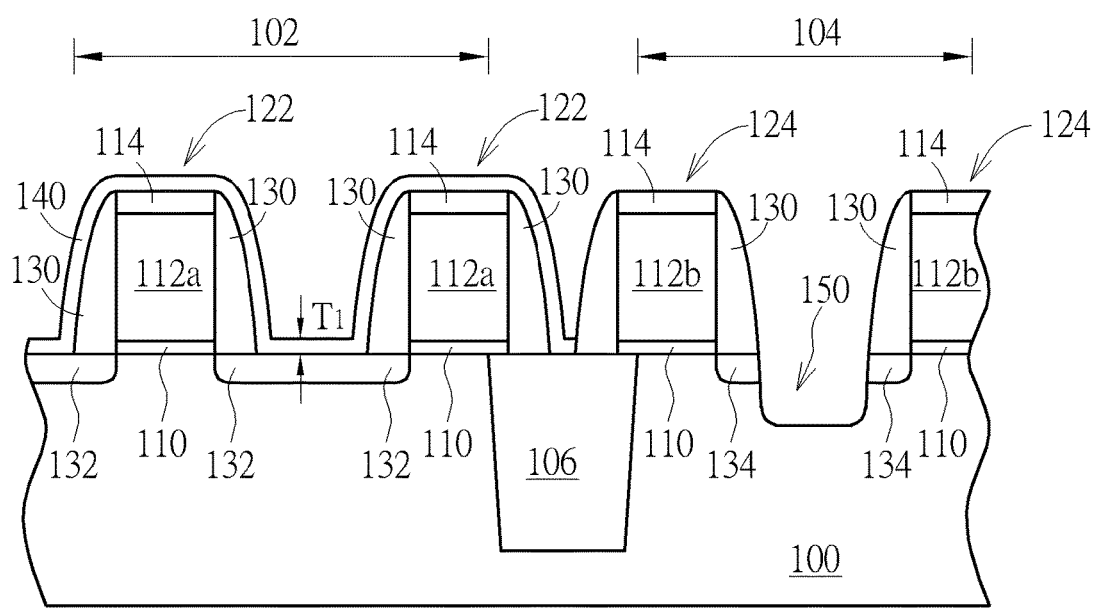

Please refer to FIG. 2. Then, a mask layer 140 is formed on the substrate 100. Particularly, the mask layer 140 is formed in the pMOS region 104 for covering and protecting the gate structure 122. Additionally, a disposal spacer (not shown) can be formed on the spacers 130 in the nMOS region 102 if required. The mask layer 140 and the disposal spacers can include silicon nitride (hereinafter abbreviated as SiN) or silicon carbon nitride (hereinafter abbreviated as SiCN), but not limited to this. Furthermore, the mask layer 140 includes a thickness $T_1$, and the thickness $T_1$ can be about 60 angstroms (Å) in the preferred embodiment, but not limited to this. After forming the mask layer 140, an etching process is performed to etch the substrate 100 at the two sides of the gate structure 124. During the etching process, the cap layer 114, the spacers 130 in the nMOS region 104 and the mask layer 140 covering the entire pMOS region 102 and serve as an etching mask. Consequently, a recess 150 is formed in the substrate 100 respectively at two sides of the gate structure 124. As shown in FIG. 2, a bottom and sidewalls of the recess 150 all include homogenous silicon material.

Figure 3:
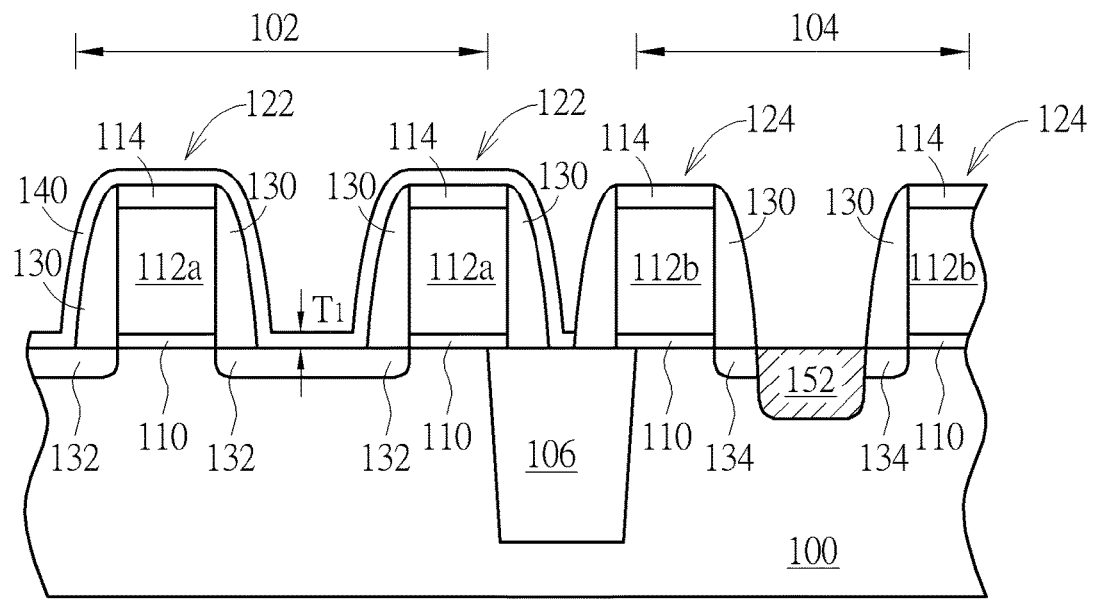

Please refer to FIG. 3. After forming the recess 150, a cleaning process is performed to remove native oxides or other contaminants from the recess 150. Then, a SEG method is performed to form an epitaxial layer 152 respectively in each recess 150. The epitaxial layers 152 can include materials suitable for the nMOS transistor device. For example, the epitaxial layers 152 can include silicon phosphorus (SiP) or silicon carbide phosphorus (SiCP), but not limited to this. Because the lattice constant of SiP or SiCP is smaller than that of the substrate, the epitaxial SiP or SiCP layers serve as a strained-silicon structure and causes changes to band structure. Therefore the carrier mobility in the channel region is increased and the performance of the nMOS transistor device is consequently improved. Furthermore, ion implantation can be performed before or after forming the epitaxial layers 152, or during forming the epitaxial layers 152, if required. Thus dopants required by the nMOS transistor device are implanted into the epitaxial layers 152. Because the ion implantation and choices of the dopant are well-known to those skilled in the art, the details are omitted herein in the interest of brevity. Accordingly, the epitaxial layers 152 serve as a source/drain for the nMOS transistor device.

Figure 4:
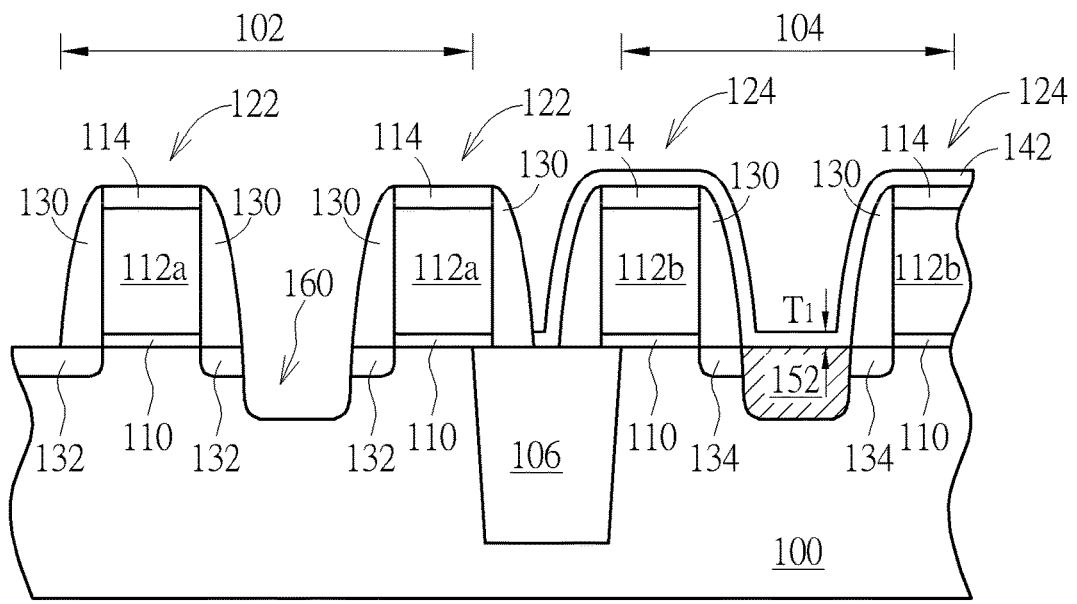

Please refer to FIG. 4. After forming the epitaxial layers 152, the mask layer 140 is removed. The mask layer 140 can be removed by a hypophosphorous acid (hereinafter abbreviated as HPA) of 120° C. with dilute hydrofluoric acid (hereinafter abbreviated as DHF), or HPA of 150° C. without DHF, but not limited to this. Then, another mask layer 142 is formed on the substrate 100. Particularly, the mask layer 142 is formed in the nMOS region 104 for covering and protecting the gate structure 124. Additionally, a disposal spacer (not shown) can be formed on the spacer 130 in the pMOS region 102. The mask layer 142 and the disposal spacers can include SiN or SiCN, but not limited to this. Furthermore, the mask layer 142 also includes a thickness $T_1$, and the thickness $T_1$ can be about 60 Å in the preferred embodiment, but not limited to this. After forming the mask layer 142, an etching process is performed to etch the substrate 100 at the two sides of the gate structure 122. During the etching process, the cap layer 114, the spacers 130 in the pMOS region 102, and the mask layer 142 covering the entire nMOS region 104 serve as an etching mask. Consequently, a recess 160 is formed in the substrate 100 respectively at two sides of the gate structure 122. As shown in FIG. 4, a bottom and sidewalls of the recess 160 all include homogenous silicon material.

Figure 5:
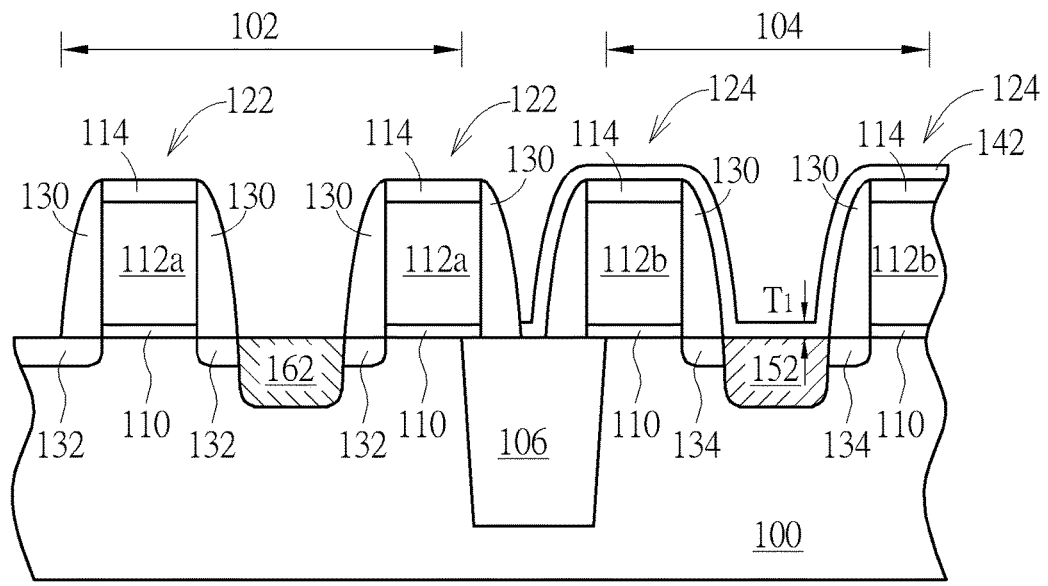

Please refer to FIG. 5. After forming the recess 160, another cleaning process is performed to remove native oxides or other contaminants from the recess 160. Then, a SEG method is performed to form an epitaxial layer 162 respectively in each recess 160. The epitaxial layers 162 can include materials suitable for pMOS transistor device. For example, the epitaxial layers 162 can include silicon germanium (hereinafter abbreviated as SiGe), but not limited to this. Because the lattice constant of SiGe is larger than that of the substrate, the epitaxial SiGe layer serves as a strained-silicon structure and causes changes to band structure. Therefore the carrier mobility in the channel region is increased and the performance of the pMOS transistor device is consequently improved. Furthermore, ion implantation can be performed before or after forming the epitaxial layers 162, or during forming the epitaxial layers 162. Thus dopants required by the pMOS transistor device, such as boron (B), are implanted into the epitaxial layers 162. Because the ion implantation and choices of the dopant are well-known to those skilled in the art, the details are omitted herein in the interest of brevity. Accordingly, the epitaxial layers 162 such as, for example but not limited to, SiGeB, serve as a source/drain for the pMOS transistor device.

Figure 6:
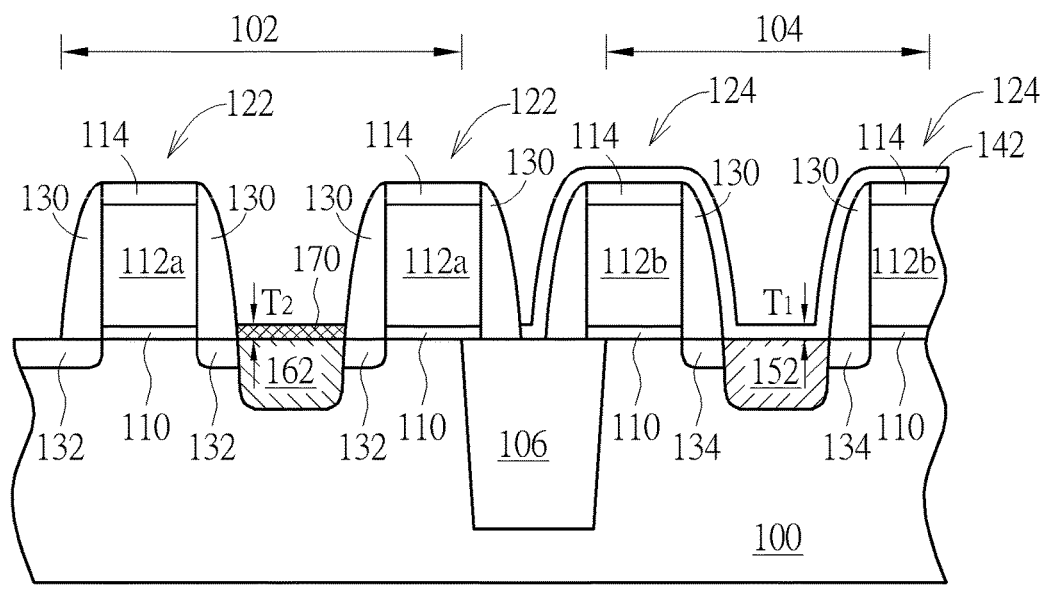

Please refer to FIG. 6. After forming the epitaxial layers 162, a local protecting cap 170 is formed. According to the preferred embodiment the local protecting cap 170 is formed by a chemical growth, particularly speaking, the local protecting cap 170 is formed by a chemical oxide growth, instead of the conventional thermal oxide growth. For example but not limited to, the local protecting cap 170 is formed by the chemical oxide growth including a sulfuric peroxide mixture (hereinafter abbreviated as SPM) and a room temperature standard solution (hereinafter abbreviated as RT SC1). SPM includes a combination of: $H_2SO_4$: $H_2O_2$:$H_2O$, and RT-SC1 includes a combination of: $NH_4OH$:$H_2O_2$:$H_2O$. According to the preferred embodiment, the chemical oxide growth is to form an oxide layer only on semiconductor material, that is the exposed epitaxial layers 162 while other exposed structures such as the cap layer 114, the spacers 130 or the disposal spacers, and the mask layer 142 are impervious to the chemical oxide growth. Consequently, the final oxide layer is locally confined on the epitaxial layers 162. That is, the local protecting cap 170 is formed on epitaxial layers 162. The local protecting cap 170 includes a thickness $T_2$ and the thickness $T_2$ is between 3 angstroms (Å) and 12 Å. Preferably, the thickness T of the local protecting cap 170 is between 6 Å and 7 Å.

Figure 7:
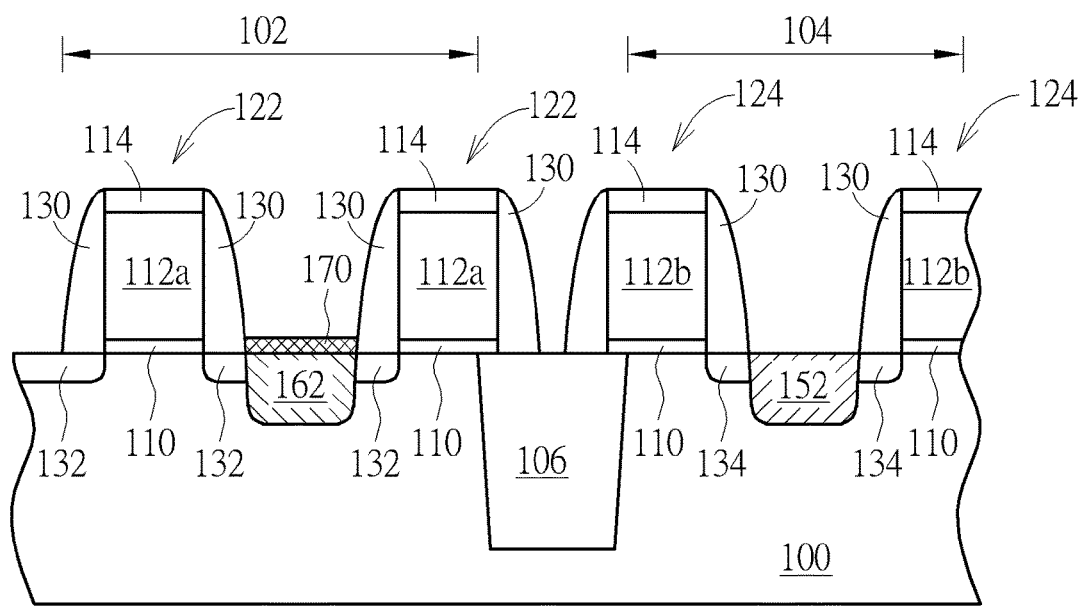

Please refer to FIG. 7. After forming the local protecting cap 170, the mask layer 142 is removed. The mask layer 142 can be removed by a HPA of 120° C. with DHF, or preferably by a HPA of 150° C. without DHF, but not limited to this. An etching rate of the local protecting cap 170 is different from an etching rate of the mask layer 142, and according to the preferred embodiment, the local protecting cap layer 170 includes silicon oxide while the mask layer 142 includes SiN. Therefore, the local protecting cap 170 protects the epitaxial layers 162 during removing the mask layer 142. More important, the local protecting cap 170 itself may be consumed during removing the mask layer 142, therefore the local protecting cap 170 and the mask layer 142 may be removed from the substrate 100. It is found that only 2 Å of the epitaxial layer 162 is consumed due to the protection rendered from the local protecting cap 170 while 30 Å of epitaxial layer is consumed when there is no protecting cap being provided. That is, consumption to the epitaxial layers 162 is greatly reduced and thus strain stress loss is mitigated, even avoided.

Additionally, It is well-known that the thermal oxide growth is to form oxide layers not only formed on surface of semiconductor (such as SiGe and Si in the preferred embodiment) material, but also formed on surface of insulating material (such as the spacers 130, the cap layer 114, and the mask layer 142 which including insulating materials in the preferred embodiment). Those thermal oxide layers obstruct the removal of the mask layer 142 and increases process complexity. Therefore, the thermal oxide growth must be discarded according to the preferred embodiment.

According to the method for manufacturing the semiconductor devices provided by the present invention, a local protecting cap is formed on the first epitaxial layers so that the first epitaxial layers are protected during removing the first mask layer. Consequently, consumption and/or damage to the first epitaxial layers are significantly reduced and thus strain stress loss is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing semiconductor devices, comprising:
    providing a substrate comprising a first gate structure and a second gate structure formed thereon, the first gate structure and the second gate structure being complementary to each other;
    forming a second mask layer covering the second gate structure;
    forming second recesses in the substrate at two respective sides of the first gate structure;
    forming a second epitaxial layer in each second recess;
    forming a local protecting cap on the second epitaxial layers by a chemical growth, and the chemical growth comprising sulfuric peroxide mixture (SPM) and a room temperature standard solution (RT SC1); and
    removing the second mask layer.

2. The method for manufacturing the semiconductor devices according to claim 1, further comprising following steps before forming the second mask layer:
    forming a first mask layer covering the first gate structure;
    forming first recesses at two respective sides of the second gate structure; and
    forming a first epitaxial layer in each first recess.

3. The method for manufacturing the semiconductor devices according to claim 2, further comprising removing the first mask layer after forming the first epitaxial layers.

4. The method for manufacturing the semiconductor devices according to claim 2, wherein the first epitaxial layers comprise silicon phosphorus (SiP).

5. The method for manufacturing the semiconductor devices according to claim 1, wherein the second epitaxial layers comprise silicon germanium (SiGe).

6. The method for manufacturing the semiconductor devices according to claim 1, wherein an etching rate of the local protecting cap is different from an etching rate of the second mask layer.

7. The method for manufacturing the semiconductor devices according to claim 6, wherein the local protecting cap comprises silicon oxide (SiO) and the second mask layer comprises silicon nitride (SiN).

8. The method for manufacturing the semiconductor devices according to claim 1, wherein the local protecting cap comprises a thickness and the thickness is between 3 and 12 angstroms (Å).

* * * * *